United States Patent
Qin et al.

(10) Patent No.: US 9,912,352 B1
(45) Date of Patent: Mar. 6, 2018

(54) HAMMING DISTANCE BASED BINARY REPRESENTATIONS OF NUMBERS

(71) Applicant: Western Digital Technologies, Inc., San Jose, CA (US)

(72) Inventors: Minghai Qin, San Jose, CA (US); Chao Sun, San Jose, CA (US); Dejan Vucinic, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/614,914

(22) Filed: Jun. 6, 2017

(51) Int. Cl.
 *H03M 7/30* (2006.01)
 *H03M 7/02* (2006.01)
 *H03M 7/24* (2006.01)

(52) U.S. Cl.
 CPC ............ *H03M 7/6035* (2013.01); *H03M 7/02* (2013.01); *H03M 7/24* (2013.01)

(58) Field of Classification Search
 CPC .......... H03M 7/6035; H03M 7/02; H03M 7/24
 USPC .............................................. 341/50, 58, 59
 See application file for complete search history.

(56) References Cited

U.S. PATENT DOCUMENTS

| | | | | |
|---|---|---|---|---|
| 5,491,479 A | * | 2/1996 | Wilkinson | H04N 5/9264 341/58 |
| 6,084,535 A | * | 7/2000 | Karabed | G11B 20/10009 341/106 |
| 6,404,820 B1 | * | 6/2002 | Postol | H03M 13/15 341/200 |
| 7,149,955 B1 | * | 12/2006 | Sutardja | H03M 13/19 341/58 |
| 7,860,910 B2 | | 12/2010 | Howard | |
| 8,223,042 B2 | | 7/2012 | Abbasfar | |
| 9,369,486 B2 | | 6/2016 | Lewis et al. | |
| 2016/0012255 A1 | | 1/2016 | Bringer et al. | |
| 2016/0352359 A1 | | 12/2016 | Ordentlich et al. | |

OTHER PUBLICATIONS

IEEE, "IEEE Standard for Floating-Point Arithmetic," IEEE Computer Society, Aug. 29, 2008, 70 pages.

* cited by examiner

*Primary Examiner* — Brian Young
(74) *Attorney, Agent, or Firm* — Vierra Magen Marcus LLP

(57) ABSTRACT

Technology is described herein for encoding and decoding numbers. In one aspect, floating point numbers are represented as binary strings. The binary strings may be encoded in a manner such that if one bit flips, the average and maximum distortion in the number that is represented by the binary string is relatively small. In one aspect, 2^n binary strings are ordered across an interval [a, b) in accordance with their Hamming weights. Numbers in the interval may be uniformly quantized into one of 2^n sub-intervals. For example, floating point numbers in the interval [a, b) may be uniformly quantized into 2^n sub-intervals. These 2^n sub-intervals may be mapped to the 2^n binary strings. Thus, the number may be assigned to one of the 2^n binary strings. Doing so may reduce the distortion in the number in the event that there is a bit flip in the assigned binary string.

20 Claims, 8 Drawing Sheets

300

| Binary | Floating Point |
|---|---|
| 0000 | 0.0 |
| 0001 | 0.0625 |
| 0010 | 0.125 |
| 0011 | 0.1875 |
| 0100 | 0.25 |
| 0101 | 0.3125 |
| 0110 | 0.375 |
| 0111 | 0.4375 |
| 1000 | 0.5 |
| 1001 | 0.5625 |
| 1010 | 0.625 |
| 1011 | 0.6875 |
| 1100 | 0.75 |
| 1101 | 0.8125 |
| 1110 | 0.875 |
| 1111 | 0.9375 |

| Binary | Floating Point |
|---|---|
| 0000 | 0.0 |
| 0001 | 0.0625 |
| 0010 | 0.125 |
| 0100 | 0.1875 |
| 1000 | 0.25 |
| 0011 | 0.3125 |
| 0101 | 0.375 |
| 0110 | 0.4375 |
| 1001 | 0.5 |
| 1010 | 0.5625 |
| 1100 | 0.625 |
| 0111 | 0.6875 |
| 1011 | 0.75 |
| 1101 | 0.8125 |
| 1110 | 0.875 |
| 1111 | 0.9375 |

Fig. 4

HAMMING DISTANCE BASED BINARY REPRESENTATIONS OF NUMBERS

BACKGROUND

The present disclosure relates to technology for digitally encoding and decoding numbers.

One representation of numbers is the IEEE 754 standard for representing floating point numbers. In one implementation, referring to FIG. 1, a floating-point number 10 has a binary representation in which one bit is used for the sign 12, "e" bits are used for an exponent 14, and "m" bits are used for a mantissa 16. Thus, the floating point number 10 may be represented by a string of e+m+1 bits. This string of bits may be stored to memory and/or processed within a digital computer.

BRIEF DESCRIPTION OF THE DRAWINGS

FIG. 3 depicts a naïve way of mapping numbers to binary strings.

FIG. 4 depicts one embodiment of mapping numbers to binary strings.

DETAILED DESCRIPTION

Technology is described herein for encoding and decoding numbers. In one embodiment, floating point numbers are represented as binary strings. The binary strings may be encoded in a manner such that if one bit flips, the average distortion in the floating point number that is represented by the binary string is relatively small. Similarly, binary strings may be encoded in a manner such that if one bit flips, the maximum distortion in the floating point number that is represented by the binary string is relatively small. For example, the average and/or maximum distortion may be within a tolerance of an application, such as a machine learning algorithm. Moreover, if more bits are used in the binary strings, the average distortion due to a bit flip may go down. Likewise, the maximum distortion due to a bit flip may go down if more bits are used in the binary strings.

Figure 1:
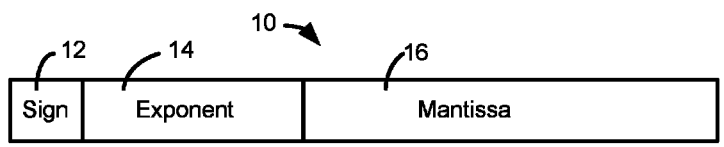
FIG. 1 is a conventional binary representation of a floating-point number.

A weakness of some conventional techniques for representing numbers as a binary string is that if a single bit in the binary string is flipped, this can lead to a very large distortion in the number being represented. Consider the case in which the conventional floating point representation of FIG. 1 is used. If the most significant bit in the exponent 14 were to be flipped, the floating point number could change from about the maximum floating point number to almost the lowest floating point number (in absolute value) that can be represented. For example, if the exponent has 11 bits, then the number could be flipped from about $2^{1023}$ to $2^{0}$ (assuming a 1 to 0 flip of the most significant bit in the exponent). Other bit flips can also lead to very large changes in the floating point number being represented by the bit string.

When the bit strings are stored to memory, there is a small, but finite probability that reading back the bit string does not result in the same information that was intended to be stored therein. For example, some memory cells be programmed to one of two or more data states based on a charge stored in a charge storage region of the memory cell. The memory cell may function as a transistor, with the amount of charge controlling the threshold voltage of the memory cell transistor. Over time the amount of charge stored in the memory cell can change, resulting in a change in the threshold voltage of the memory cell. As another example, some memory cells be programmed to one of two or more data states based on the resistance of the memory cell. Over time the resistance of the memory cell can change. In either case, the data state being represented could change. This change in data state may result in a "bit flip". By a bit flip, it is meant the a bit that was programmed as a "1" is read back as a "0", or a bit that was programmed as a "0" is read back as a "1".

In one technique, redundant bits can be programmed into the memory cells to recover from potential changes in data state. As one example, a group of memory cells may be programmed with a codeword, which is determined based on an error correcting code (ECC). The codeword may represent the data redundantly. For example, to store a page of 512 bytes of data, some memory cells may be used to store the actual 512 bytes of data and others may be used to store error correcting codes. Using a larger number of redundant bits helps to recover from more bit flips. Thus, using a larger number of redundant bits is one way to achieve stronger ECC.

Thus, one possible solution to potential bit flips is to use strong error correction codes (ECC) when storing the bit strings to memory. For example, a memory controller in a memory system may use strong ECC when storing a floating point number (represented as a bit string) to a memory array in the memory system. However, additional redundant bits need to be stored to provide for the strong ECC. For applications that are very memory intensive, using strong ECC is a drawback.

Bit flips may also result during transmission of the bit strings to or from memory. One technique to avoid or at least reduce such transmission bit flips is to keep the transmission rate within a safe data transmission rate. However, some applications may need a very large amount of data. Staying within a safe data transmission rate can reduce the productiveness of the application.

In some embodiments, binary strings that represent numbers in an interval [a, b) are clustered based on Hamming weights. For example, $2^n$ binary strings may be placed into n+1 groups that are ordered based on their Hamming weights. Each of the groups may contain binary strings with the same Hamming weight. In one embodiment, numbers in an interval assigned to one of $2^n$ sub-intervals. For example, the numbers may be uniformly quantized into one of $2^n$ sub-intervals. For example, floating point numbers in the interval [a, b) may be uniformly quantized into $2^n$ sub-intervals in the interval [a, b). These $2^n$ sub-intervals (or bins) may be mapped to the $2^n$ binary strings that are ordered across the interval in accordance with Hamming weight. Thus, the numbers may be assigned to one of the $2^n$ binary strings. Doing so may reduce the distortion in the number in the event that there is a bit flip in the assigned binary string. Note that the distortion may be defined relative to the size of the interval [a, b). For example, if the interval is [0, 1), then an error of 0.5 due to a bit flip may be defined as a 50 percent distortion.

Note that herein an "interval" (or "sub-interval") may contain any type of number. The interval may include, but is not limited to, the set of all real numbers in the interval, the set of all floating point numbers in the interval, the set of all integers in the interval, etc.

In one embodiment, the binary strings may be stored to memory without using ECC or, alternatively, with using fewer redundant bits for ECC. There may be some chance that there will be a bit flip in a binary string, but some applications may be able to tolerate such bit flips, providing that the maximum and/or average distortion due to a bit flip is less than a certain percentage of the interval.

In one embodiment, the binary strings are used to store parameters for a machine learning algorithm, such as weights in a neural network. Neural networks may mimic the function of a human brain in object recognition, decision making, etc. Machine learning may require an enormous number of parameters, such as weights in a neural network. The parameters may be stored in non-volatile storage (also referred to as non-volatile memory), and be read into the processor when a prediction is to be made. As noted, there is a small chance that a bit will be flipped either during storage or transmission of a binary representation of the parameters. Error correction codes can be used to guard against bit flips, but at the cost of additional storage. Moreover, additional time is need to read and process the redundant bits. The ECC-induced overhead may limit how much information can be processed. For example, the ECC-induced overhead may limit have many frames per second the system can process in, for example, object recognition. Techniques described herein can improve performance of machine learning applications. Note that techniques described herein are not limited to machine learning applications.

Figure 2A:
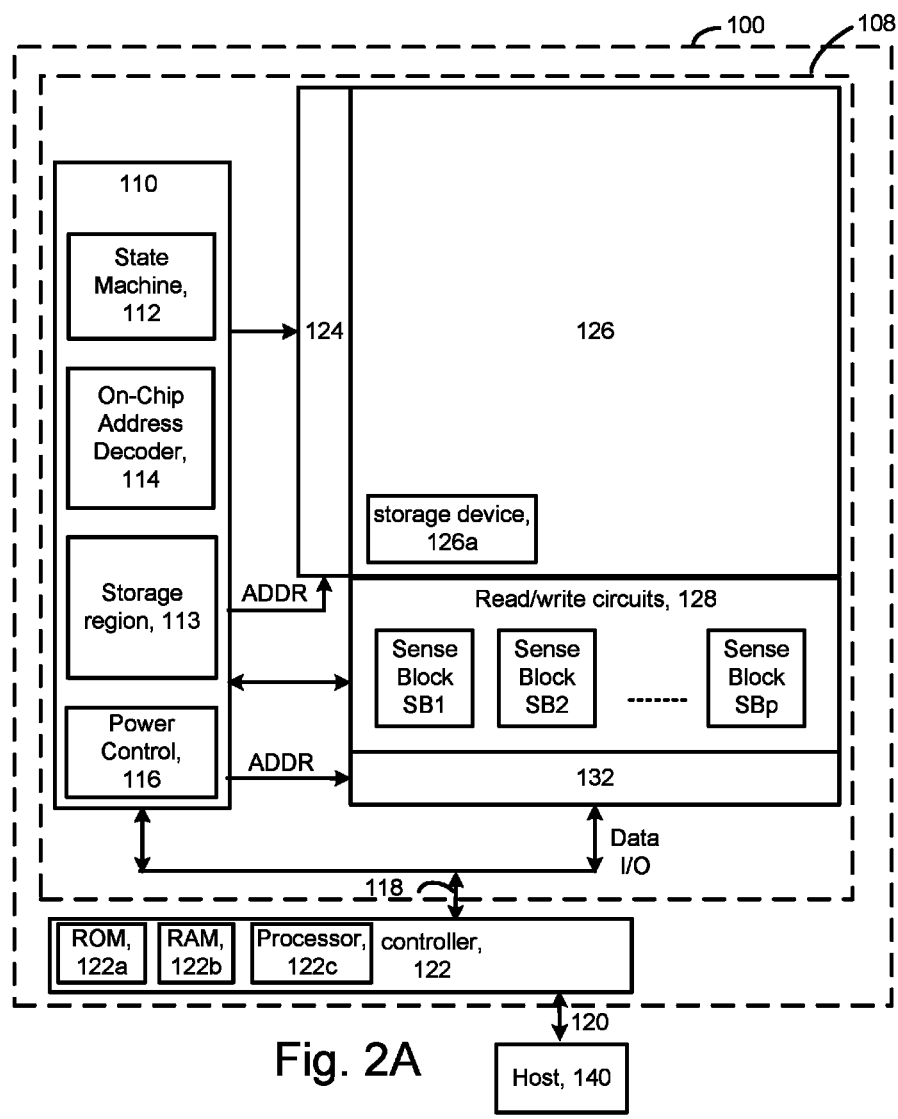
FIG. 2A is a functional block diagram of a memory device in which embodiments may be practiced.

Technology described herein may be used with a variety of types of memory systems. However, it will be appreciated that technology described herein is not limited to memory systems. FIG. 2A is a functional block diagram of a memory device in which embodiments may be practiced. The memory system 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory system 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for operating the memory device such as programming parameters for different rows or other groups of memory cells. These programming parameters could include bit line voltages and verify voltages.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD select gates and source lines. The sense blocks can include bit line drivers, in one approach. An SGS select is a gate transistor at a source-end of a NAND string, and an SGD select gate is a transistor at a drain-end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide functionality described herein. Alternatively or additionally, the processor can access code from a storage device 126a of the memory structure, such as a reserved area of memory cells in one or more word lines.

The code is used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports. In some embodiments, the controller 122 encodes floating point numbers into binary strings. The controller 122 along with control circuitry 110, and read/write circuits 128 may store the binary strings in the memory array 126.

Other types of non-volatile memory in addition to NAND flash memory can also be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels.

One of skill in the art will recognize that this technology is not limited to the two dimensional and three dimensional exemplary structures described but covers all relevant memory structures within the spirit and scope of the technology as described herein and as understood by one of skill in the art.

Figure 2B:
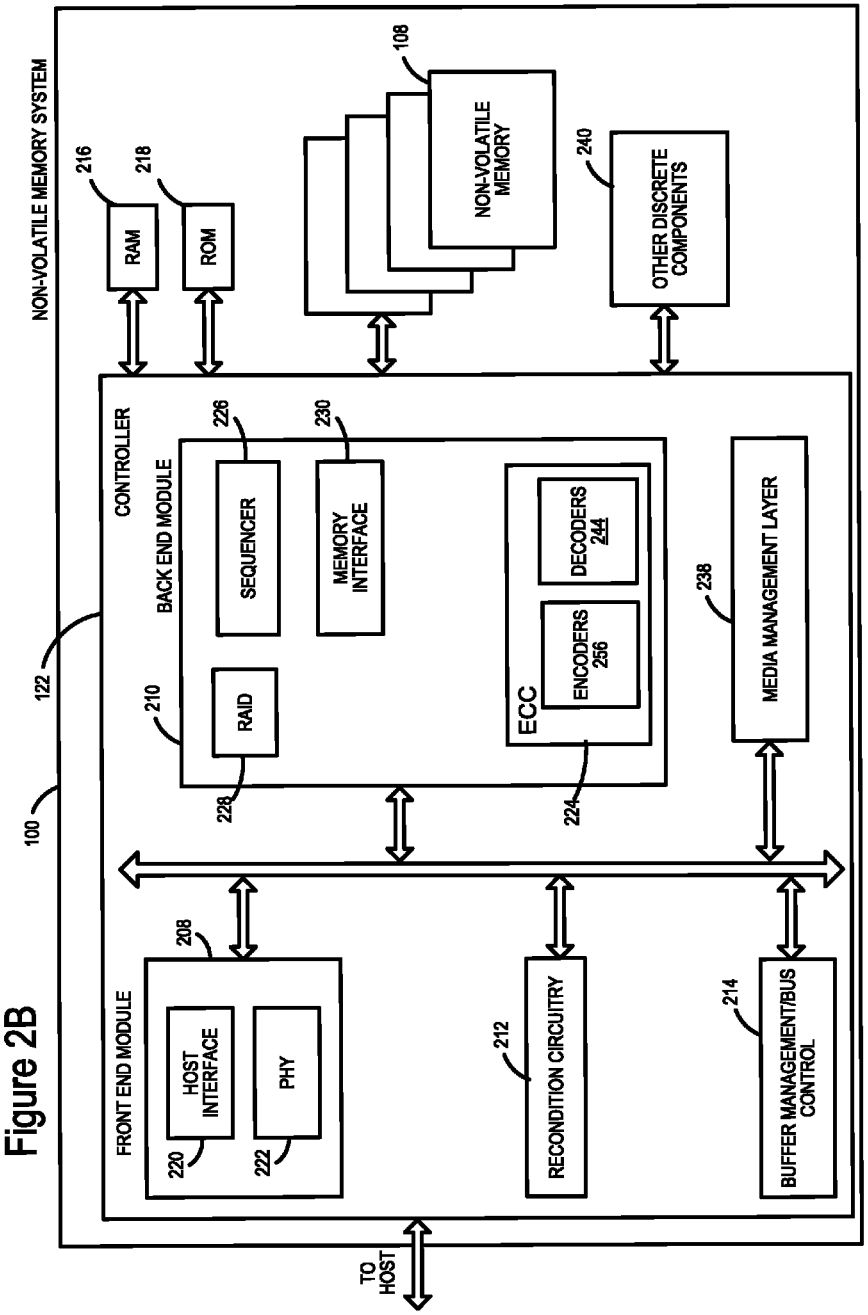
FIG. 2B is a block diagram of example memory system, depicting more details of Controller.

FIG. 2B is a block diagram of example memory system 100, depicting more details of Controller 122. In one embodiment, the system of FIG. 2B is a solid state drive. As used herein, a memory Controller is a device that manages data stored on memory and communicates with a host, such as a computer or electronic device. A memory Controller can have various functionality in addition to the specific functionality described herein. For example, the memory Controller can format the flash memory to ensure the memory is operating properly, map out bad memory cells, and allocate spare memory cells to be substituted for future failed cells. Some part of the spare cells can be used to hold firmware to operate the flash memory Controller and implement other features. In operation, when a host needs to read data from or write data to the memory, it will communicate with the memory Controller. If the host provides a logical address (LA) to which data is to be read/written, the memory Controller can convert the logical address received from the host to a physical address in the memory. (Alternatively, the host can provide the physical address). The memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface. In one embodiment, memory system 100 may be a card based system, such as a secure digital (SD) or a micro secure digital (micro-SD) card. In an alternative embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 2B, Controller 122 includes a front end module 208 that interfaces with a host, a back end module 210 that interfaces with the one or more non-volatile memory die 108, and various other modules that perform functions which will now be described in detail.

The components of Controller 122 depicted in FIG. 2B may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include or comprise software stored in a processor readable device (e.g., memory) to program a one or more processors for Controller 122 to perform the functions described herein. The architecture depicted in FIG. 2B is one example implementation that may (or may not) use the components of Controller 122 depicted in FIG. 2B (i.e. RAM, ROM, processor).

Controller 122 may include recondition circuitry 212, which is used for reconditioning memory cells or blocks of memory. Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 2B as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

The front end module 208 contains non-transitory storage, in one embodiment. The non-transitory storage may be volatile or non-volatile. For example, the non-transitory storage could include, but is not limited to, buffers, registers, RAM. The non-transitory storage is used to store digital representation of numbers received from host, in one embodiment. For example, the host may send floating point numbers, which can be stored in non-transitory storage in front end module 208. Note that the digital representation of numbers received from host can be stored in non-transitory storage elsewhere in controller 122.

Back end module 210 includes an error correction Controller (ECC) engine 224 that encodes the data bytes received from the host, and decodes and error corrects the data bytes read from the non-volatile memory. The ECC engine 224 has one or more decoders 244 and one or more encoders 256. In one embodiment, the ECC engine 224 comprises a low-density parity check (LDPC) decoder. In one embodiment, the decoders 244 include a hard decoder and a soft decoder. An output of the one or more decoders 244 may be provided to the host.

In one embodiment, the ECC engine 224 encodes floating point numbers to binary strings, as described herein. Note that the ECC engine 224 does not necessarily add error correction codes to the binary strings, but that is one possibility. The ECC engine 224 may also decode bit strings back to floating point numbers. The ECC engine 224 contains non-transitory storage, in one embodiment. The non-transitory storage may be volatile or non-volatile. For example, the non-transitory storage could include, but is not limited to, buffers, registers, RAM. The non-transitory storage in the ECC engine 224 is used to store the binary strings and the floating point numbers, in one embodiment. Note that the binary strings and the floating point numbers can be stored in non-transitory storage elsewhere in the controller 122. For example, the floating point numbers and binary strings can be stored in RAM 216 to, for example, facilitate the encoding and decoding processes as described herein.

A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface.

Additional components of system 100 illustrated in FIG. 2B include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Media Management Layer (MML) 238 may be integrated as part of the management that may handle errors and interfacing with the host. In one embodiment, MML 238 is a flash translation layer. In particular, MML may be responsible for the internals of NAND management. In particular, the MML 238 may include an algorithm in the memory device firmware which translates writes from the host into writes to the memory of die 108. The MML 238 may be needed because: 1) the memory may have limited endurance; 2) the memory may only be written in multiples of pages; and/or 3) the memory may not be written unless it is erased as a block. The MML 238 understands these potential limitations of the memory which may not be visible to the host. Accordingly, the MML 238 attempts to translate the writes from host into writes into the memory.

Controller 122 may interface with one or more memory dies 108. In one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

FIG. 3 depicts a table 300 showing a naïve way of mapping numbers to binary strings. In this example, the numbers may be floating point numbers. In table 300, there are 16 binary strings. The number space may be numbers in the interval [0, 1). For example, the number space could be all real numbers in in the interval [0, 1). Note that the numbers may be assigned to 16 sub-intervals. For example, table 300 contains a set of floating point numbers [0.0, 0.0625, . . . 0.9375}. This set contains 16 values, which may be referred to as "indices."

The binary strings in table 300 are naively ordered in accordance with their binary value. Each floating point number in the set is mapped to one binary string. For example, the floating point value "0.0" is mapped to the binary string "0000," the floating point value "0.0625" is mapped to the binary string "0001."

Two of the values in each column in table 300 are circled to illustrate the impact of a single bit flip in the binary string. If the value of "1111" were to change to "0111," this means that the floating point number that is represented changes from 0.9375 to 0.4375. This represents a 50 percent change within the interval [0, 1). This change (or error) is referred to herein as a "distortion." Hence, a single bit flip can lead to a very high distortion. There are other cases which can also have a 50 percent distortion. For example, if the value of "0010" were to change to "1010", this means that the floating point number that is represented changes from 0.125 to 0.625. This again represents a 50 percent change of the interval. Hence, a single bit flip can lead to a very high distortion.

Another observation is that even if more bits are used for the binary string, the distortion is not reduced. For example, consider the case if 32 bits are used for the binary string. In this case, if the most significant bit of the binary string flips, this again results in essentially a 50 percent distortion.

FIG. 4 is a table 400 to illustrate one embodiment of mapping numbers to binary strings. A "binary string" could also be referred to as a "binary vector." In this example, the table 400 has 16 binary strings. The number space is the interval [0, 1). The number space could be all real numbers in the interval [0, 1). However, the number space does not need to contain all real numbers in the interval [0, 1). Numbers in the interval [0, 1) may be uniformly quantized to 16 sub-intervals, in accordance with one embodiment. These 16 sub-intervals may correspond to the 16 binary strings. Stated another way, table 400 depicts one possible mapping of sub-intervals to binary strings. The mapping can be used to map floating point numbers to binary strings. For example, the mapping could be used to map a binary representation of a floating point number in accordance with the IEEE 754 standard into a binary string. Note that the mapping in table 400 is quite simple in that there are only four bits in each string. As will be explained below, using more bits in the binary strings can reduce the average distortion.

In table 400, the binary strings may be ordered in accordance with their Hamming weights. This, in effect, orders the binary strings across the interval [0, 1) in accordance with their Hamming weights. In table 400, the binary string with a Hamming weight of zero is first. By "first" it is meant that it is the first binary string at the lower end of the interval [0, 1). Next in the order are all of the binary strings with a Hamming weight of one (e.g., 0001, 0010, 0100, 1000). Next in the order are all of the binary strings with a Hamming weight of two (e.g., 0011, 0101, 0110, 1001, 1100). Next in the order are all of the binary strings with a Hamming weight of three (e.g., 0111, 1011, 1101, 1110). Next in the order is the binary string with a Hamming weight of four (1111). Thus, the last binary string at the higher end of the interval [0, 1). Also note that when ordering binary string according to Hamming weights, those binary strings with the same Hamming weight may be clustered in the same group. Herein, such a group is referred to as a Hamming group.

Two of the entries in each column are circled to illustrate the impact of a single bit flipping. If the value of "1111" were to change to "0111", this means that the floating point number that is represented changes from 0.9375 to 0.6875. This represents a 25% change relative to the size of the interval. Hence, a single bit flip leads to a lower distortion than in the similar case for the naïve representation of FIG. 3. There are other cases which can also benefit. For example, if the value of "0010" were to change to "1010", this means that the floating point number that is represented changes from 0.125 to 0.5625. This represents a 43.72 percent change of relative to the size of the interval. Hence, there is also some improvement relative to the naïve representation of FIG. 3. Note that there will not necessarily be improvement for all cases. However, using more bits for the binary strings can reduce the average distortion. Also, using more bits for the binary strings can reduce the maximum distortion. Since, typically many more than four bits will be used for the binary strings, the average and maximum distortion can be improved significantly relative to the naïve representation of FIG. 3.

Also note that the floating point representation of FIG. 1 also suffers from the problem that using more bits might not reduce the average or maximum distortion. For example, if the exponent has 11 bits, then the value that is represented can change from about $2^{1023}$ to $2^0$ (assuming a 1 to 0 flip of the most significant bit in the exponent). If the exponent has 8 bits, then the value that is represented could change from about $2^{127}$ to $2^0$ (assuming a 1 to 0 flip of the most significant bit in the exponent). Note that relative to the size of the numbers in the interval, the distortion does not go down when using more bits for the exponent.

Figure 5A:
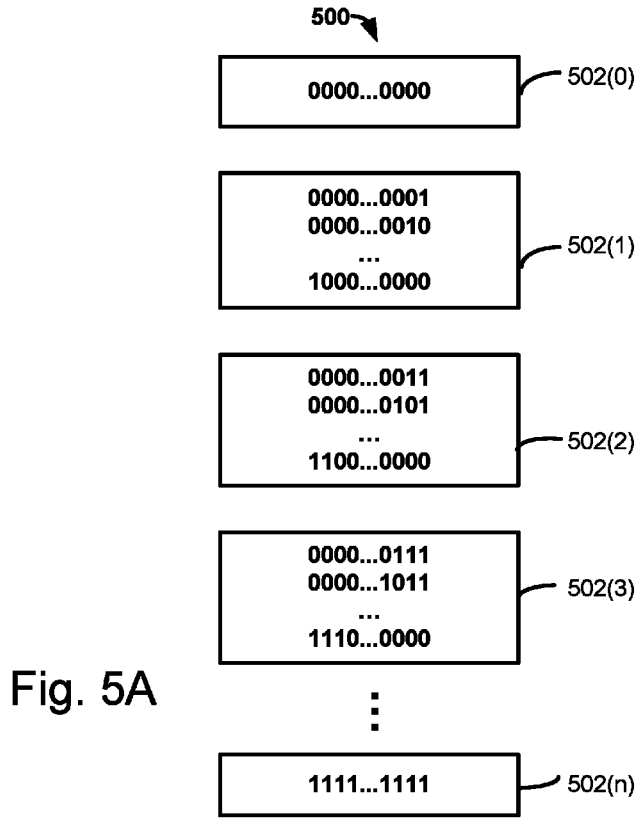
FIG. 5A depicts one embodiment of clustering binary strings into groups in accordance with their Hamming weights.

FIG. 5A depicts one embodiment of clustering 500 binary strings into Hamming groups 502 in accordance with their Hamming weights. In one embodiment, the set of binary strings using for mapping includes all $2^n$ binary strings of length "n". Depending on the implementation, "n" might be 16, 32, 64, 128, or some other value. The binary strings have at least eight bits in this example. The binary strings are clustered into n+1 Hamming groups 502(0)-502(n). Hamming group 502(0) contains all of the binary strings of length n having a Hamming weight of 0. Hamming group 502(1) contains all of the binary strings of length n having a Hamming weight of 1. Hamming group 502(2) contains all of the binary strings of length n having a Hamming weight of 2. Hamming group 502(3) contains all of the binary strings of length n having a Hamming weight of 3. Hamming group 502(n) contains all of the binary strings of length n having a Hamming weight of n. Other Hamming groups 502 are not depicted so as to not obscure the diagram.

Note that in FIG. 5A, the binary strings are clustered based on Hamming weight. This is one example of clustering based on a Hamming distance to a base binary string of length "n." When the base binary string is all zeros, the clustering is based on Hamming weight. However, the clustering could be performed relative to another base binary string, such as the string of all ones. Herein, a "Hamming group" is defined as a group of binary strings each of length "n" that each have the same Hamming distance to a base binary string of length "n."

Continuing on with the discussion of FIG. 5A, note that a bit flip of one bit corresponds to a change from one Hamming group 502 to an adjacent Hamming group. For example, a bit flip of one bit of any of the binary strings in Hamming group 502(2) would place the binary string into either Hamming group 502(1) or Hamming group 502(3). Also note that if there are more bits in the binary strings, then there will be more Hamming groups. For example, there are n+1 Hamming groups 502 for strings of length n. Having more Hamming groups, in effect, tends to reduce the distortion in the event of a bit flip.

Figure 5B:
FIG. 5B is a diagram to illustrate a mapping of numbers in the interval [a, b) to binary strings.

FIG. 5B is a diagram to illustrate a mapping of numbers in the interval [a, b) to binary strings. In one embodiment, the interval is for real numbers in [a, b). In one embodiment, the interval is for floating point numbers in [a, b). The interval is represented by the x-axis and is divided into n+1 sub-intervals, several of which are labeled (not all sub-intervals are depicted). The sub-intervals include [a, a+r1), [a+r1, a+r2), [a+r2, a+r3), [a+r3, a+r4), ... [a+r(n−1), a+rn), [a+rn, b). Each of these sub-intervals corresponds to one Hamming group 502 of binary strings. For example, sub-interval [a, a+r1) corresponds to Hamming group 502(0), sub-interval [a+r1, a+r2) corresponds to Hamming group 502(1), etc. In one embodiment, the system maps numbers in a sub-interval to some binary string in the corresponding Hamming group 502. Note that as there are more Hamming groups 502, this can help to partition the interval into more sub-intervals. This can help to reduce the distortion in the event of a bit flip in a binary string.

Figure 6A:
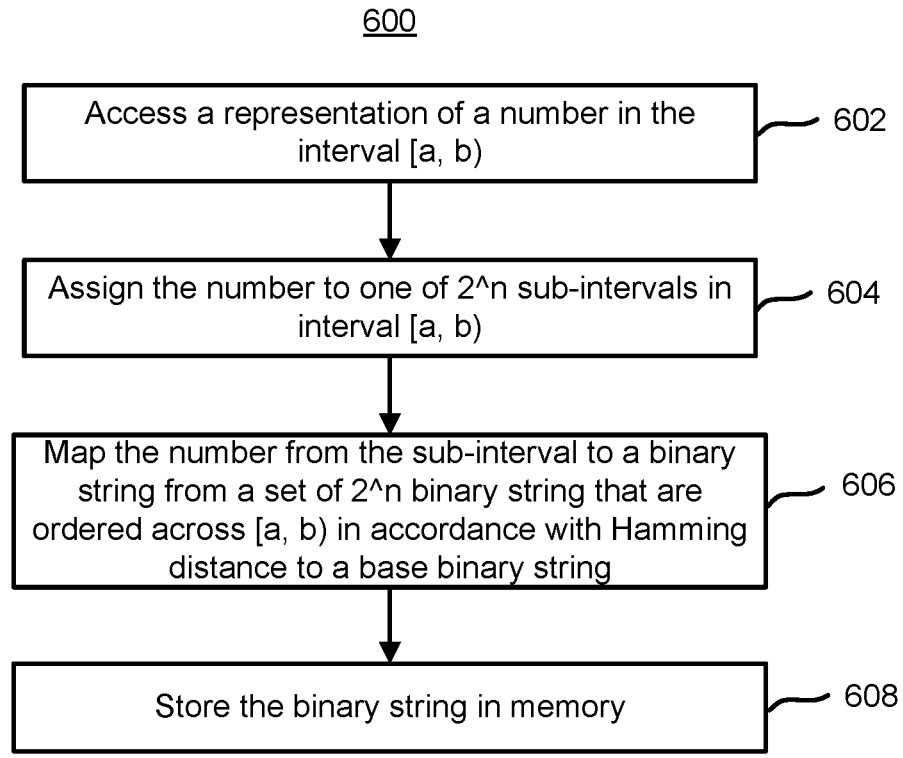
FIG. 6A is a flowchart of one embodiment of a process of mapping numbers to binary strings.

FIG. 6A is a flowchart of one embodiment of a process 600 of mapping a number to a binary string. The process 600 may use Hamming groups, as in the examples of FIGS. 4, 5A and 5B, but is not limited to those examples. The process 600 may be performed by a control circuit in the memory system 100, but is not limited to memory system 100. In one embodiment, process 600 has zero storage overhead. For example, the binary strings may be stored without any redundant bits (e.g., ECC). In one embodiment, the number to be mapped is within an interval [a, b). Note that process 600 may be repeated to encode other numbers within the interval [a, b). In one embodiment, the number(s) is/are within the interval [0, 1). Such an interval may be useful for applications such weights in a machine learning algorithm. However, a different interval may be used.

Step 602 includes accessing a representation of a number. In one embodiment, this is a digital representation of a number. The number may be a floating point number, but is not required to be a floating point number. For example, the memory system 100 may access a floating point number that is represented in accordance with the IEEE 754 standard for representing floating point numbers. As is well-known, the representation of the floating point number could be a string of bits. Note that step 602 is not limited to the floating point number being represented by the IEEE 754 standard.

Step 604 includes assigning the number to one of $2^n$ sub-intervals. These $2^n$ sub-intervals are non-overlapping and cover the entire interval [a, b), in one embodiment. The $2^n$ sub-intervals may be ordered from one end of the interval to the other end of the interval. In one embodiment, floating point numbers are uniformly quantized into the $2^n$ sub-intervals. Thus, step 604 may include quantizing one floating point number to one of the $2^n$ sub-intervals.

Step 606 includes mapping the number from the assigned $2^n$ sub-interval to a binary string from a set of $2^n$ binary strings that are ordered across the interval [a, b) in accordance with their distance to a base binary string of length n. In one embodiment, the base binary string has all zeros. Thus, the step 606 may include mapping the number from the assigned $2^n$ sub-interval to a binary string from a set of $2^n$ binary strings that are ordered across the interval [a, b) in accordance with their Hamming weights.

Note that the mapping of step 606 may link each of the $2^n$ binary strings to one of the $2^n$ sub-intervals. In one embodiment, the binary strings each have a length of "n". In one embodiment, the set of binary strings comprise all binary strings of length "n". For example, there are $2^n$ binary strings having length "n". In one embodiment, the binary strings have n+1 different Hamming distances to the base string. In one embodiment, the binary strings have n+1 different Hamming weights. Thus, the $2^n$ binary strings may be said to comprise n+1 Hamming groups, each of which comprises only binary strings with the same Hamming distance to the base string. In one embodiment, the $2^n$ binary strings comprise n+1 Hamming groups, each of which comprises only binary strings with the same Hamming weight.

Note that steps 604 and 606 may be performed by hardware for fast encoding. For example, steps 604 and 606 may be implemented within or by an application specific integrated circuit (ASIC), a Field Programmable Gate Array (FPGA), a circuit, a digital logic circuit, an analog circuit, a combination of discrete circuits, gates, or any other type of hardware or combination thereof.

Step 608 includes storing the binary string in non-transitory storage. In one embodiment, the binary string is stored in memory 126. The non-transitory storage may include non-volatile storage (e.g., NAND, NOR, ReRAM) or volatile storage (e.g., RAM). The binary string may be stored with other binary strings that represent other floating point numbers. In one embodiment, the system stores the binary string in non-volatile storage. For example, controller 122 may transfer the binary string to memory die 108, which stores the binary string in memory array 126 (see FIG. 2A). In one embodiment, the system does not use any error correction codes when storing the binary string in memory. Thus, the binary string can be stored (along with other binary strings) without any storage overhead. However, some error correction codes could be used. In one embodiment, the system uses a less robust ECC than might be used to store other data. For example, the system might use fewer redundant bits per page when storing binary strings encoded by process 600, than other data into memory array 126.

Note that even if one of the bits in the binary string should flip, the amount of distortion in the number represented by the bit string remains relatively low due to the encoding technique. For some applications, a small amount of distortion may be tolerable. Hence, the system can use less storage, while still staying within a tolerable amount of distortion for a given application.

Furthermore, note that the bit flip might occur during storage or during transmission to or from the storage. Thus, in one embodiment, the system over-clocks the memory when writing and/or reading the binary string(s) to/from memory. Over-clocking the memory may increase the risk that a bit will be flipped during transmission. However, as noted, a small amount of distortion may be tolerable for some applications. Hence, process 600 may allow for over-clocking of the memory, while still staying within a tolerable amount of distortion for a given application.

Figure 6B:
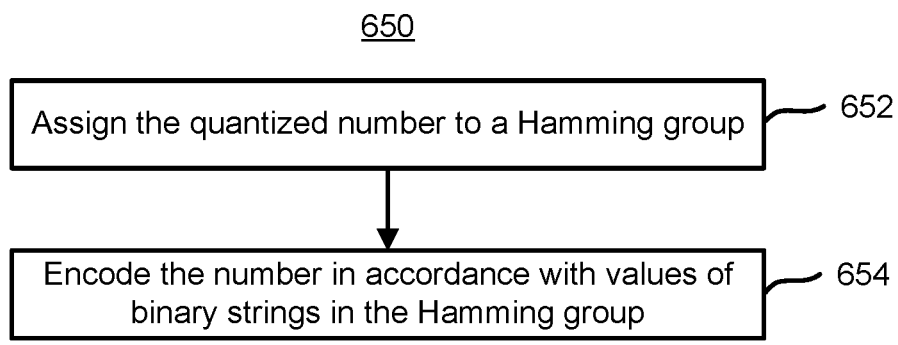
FIG. 6B is a flowchart of one embodiment of a process mapping quantized numbers to binary strings.

In one embodiment, the binary strings are ordered within a given Hamming group 502 in accordance with their binary values. For example, if there are eight bits per string, the binary strings having a Hamming weight of one may be ordered (00000001, 00000010, . . . 10000000). FIG. 6B is a flowchart of one embodiment of a process 650 of how quantized numbers may be mapped to binary strings. Here, a quantized number refers to one that has been quantized to one of $2^n$ sub-intervals in the interval referred to in process 600. The process 650 assumes that the binary strings are ordered within a given Hamming group 502 in accordance with their binary values. The process 650 may be used as one embodiment of step 606 in process 600.

Process 650 may be performed by hardware for fast encoding. For example, process 650 may be implemented within or by an application specific integrated circuit (ASIC), a Field Programmable Gate Array (FPGA), a circuit, a digital logic circuit, an analog circuit, a combination of discrete circuits, gates, or any other type of hardware or combination thereof.

In step 652, the quantized number is assigned to a Hamming group 502. There may be n+1 Hamming groups 502, assuming there are $2^n$ binary strings of length n. This step may include any technique for assigning a quantized number with a Hamming group 502. In one embodiment, the quantized number is first assigned an index based on its location within the interval. This may equate to assigning an index based on which of n+1 non-overlapping sub-intervals that the quantized number resides in.

In step 654, the quantized number is encoded in accordance with values of binary strings in the Hamming group 502. In one embodiment, there is a one-to-one mapping between quantized number in the sub-interval and binary strings in the Hamming group 502. In one embodiment, the quantized number with the lowest value in the sub-interval is mapped to the binary string having the lowest value in the Hamming group 502, the quantized floating point number with the second lowest value in the sub-interval is mapped to the binary string having the second lowest value in the Hamming group 502, etc. Thus, the quantized numbers in the sub-interval is may be encoded in accordance with values of binary strings in the corresponding Hamming group 502.

The following is a brief discussion of how using additional bits in the binary strings may reduce distortion that could result from a bit flip. For the sake of illustration, assume that there is an interval that covers all real numbers that are to be represented. For example, for a neural network, the interval might need to be [0, 1) to cover the weights used in the neural network. However, this interval is just one example. This interval may be broken into sub-intervals, which may correspond to a uniform quantization of the interval of real numbers. For the sake of illustration, the set of indices $\{0, 1, \ldots 2^n-1\}$ may represent this uniform quantization of the interval of real numbers.

Thus, an assumption may be made that there is a set of $2^n$ floating point numbers (e.g., the quantized real numbers in the interval) that are to be represented in binary form. Note that if there are other floating point numbers in a given one of the $2^n$ sub-intervals, they may be quantized to one representative floating point number to produce the set of $2^n$ floating point numbers. For example, referring back to FIG. 4, there is a set of $2^4$ floating point numbers in the table 400. Also note that the binary strings each have "n" bits.

A one-to-one mapping may be created between the $2^n$ floating point numbers and $2^n$ binary strings (each having "n" bits). For example, referring back to FIG. 4, the $2^4$ floating point numbers in the table map to the $2^n$ binary strings each having "n" bits.

A distortion (d) of a pair of binary strings ($b_1$, $b_2$) for a given mapping (f) may be defined in terms of a 1-norm distance of the floating point numbers over the whole interval of floating point numbers, as in Equation 1. Note that "f" represents the mapping from the floating point numbers to the binary strings.

$$d(f, b_1, b_2) = \frac{|f(b_1) - f(b_2)|}{2^n}, b_1, b_2, \in \{0, 1\}^n \quad (1)$$

For a given binary string, there may be a different distortion, depending on which bit in the binary string flips. The distance-1 distortion of one binary string (b) may be defined as in Equations 2 and 3. A "distance-1" distortion refers to exactly one bit in the binary string flipping. Equation 2 is for the maximum "distance-1" distortion for a binary string. That is, it is for the case that represents the bit flip that results in the maximum distortion. Equation 3 is for the average "distance-1" distortion for a binary string. That is, it is for case that represents the average distortion of the all possible one-bit flips.

$$d_{1,max}(f, b) = \max_{d_H(b,x)=1} d(f, b, x) \quad (2)$$

$$d_{1,ave}(f, b) = \frac{\sum_{x, d_H(b,x)=1} d(f, b, x)}{n} \quad (3)$$

A distortion of all of the binary strings in the set of $2^n$ binary strings may be computed from Equations 2 and 3. The distance-1 distortion of a mapping f may be defined as in Equations 4 and 5. Equation 4 is for the maximum distance-1 distortion for the mapping f. Equation 5 is for the average distance-1 distortion for the mapping f.

$$d_{1,max}(f) = \max_{b \in \{0,1\}^n} d_{1,max}(f, b) \quad (4)$$

$$d_{1,ave}(f) = \sum_{b \in \{0,1\}^n} d_{1,ave}(f, b)/2^n \quad (5)$$

Embodiments disclosed herein provide for a mapping such that $d_{1,max}(f)$ in Equation 4 is within a tolerance of an application (such as, but not limited to, a machine learning algorithm). Moreover, embodiments disclosed herein provide for a mapping in which $d_{1,max}(f)$ becomes smaller as the number of bits used in the bit strings is larger. Embodiments disclosed herein provide for a mapping such that $d_{1,ave}(f)$ in Equation 5 is within a tolerance of an application (such as, but not limited to, a machine learning algorithm). Moreover, embodiments disclosed herein provide for a mapping in which $d_{1,ave}(f)$ becomes smaller as the number of bits used in the bit strings is larger.

The cases in which more than one bit flips may also be considered. Herein, a "distance-k distortion" refers to "k" bits flipping in a single binary string. A distance-k distortion may be defined in a similar manner, as Equations 4 and 5 above. Equation 6 is for the maximum distance-k distortion. It may be seen that the maximum distance-k distortion is the maximum distance-1 distortion from Equation 4 multiplied by "k". Equation 7 is for the average distance-k distortion. It may be seen that the average distance-k distortion is the average distance-1 distortion from Equation 5 multiplied by "k".

$$d_{k,max}(f) \le k d_{1,max}(f), \quad (6)$$

$$d_{k,ave}(f) \le k d_{1,ave}(f) \quad (7)$$

Embodiments disclosed herein provide for a mapping such that $d_{k,max}(f)$ in Equation 6 is within a tolerance of an application (such as, but not limited to, a machine learning algorithm). Moreover, embodiments disclosed herein provide for a mapping in which $d_{k,max}(f)$ becomes smaller as the number of bits used in the bit strings is larger. Embodiments disclosed herein provide for a mapping such that $d_{k,ave}(f)$ in Equation 7 is within a tolerance of an application (such as, but not limited to, a machine learning algorithm). Moreover, embodiments disclosed herein provide for a mapping in which $d_{k,ave}(f)$ becomes smaller as the number of bits used in the bit strings is larger.

As noted, in some embodiments, all binary strings of length n are ordered by their Hamming weights. This may result in $2^n$ binary strings sorted into n+1 groups with the same Hamming weights. Herein, such groups may be referred to as "Hamming groups." When 1 bit error occurs, the binary string can only go to the adjacent Hamming group. The maximum distortion in one embodiment for Hamming group k is then given by Equation 8.

$$\left(\binom{n}{k} + \binom{n}{k \pm 1}\right) / 2^n \quad (8)$$

From Equation 9, it may be seen that the value is maximized when k=n/2.

$$\lim_{n \to \infty} d_{1,max}(f) \le \lim_{n \to \infty} \frac{\left(\binom{n}{n/2} + \binom{n}{n/2 \pm 1}\right)}{2^n} = \quad (9)$$

$$\lim_{n \to \infty} \frac{2\sqrt{\frac{2}{\pi n}} 2^n}{2^n} = \lim_{n \to \infty} 2\sqrt{\frac{2}{\pi n}} = 0$$

Equation 9 shows that as "n" goes to infinity the maximum distance-1 distortion goes to zero. Of course, in a real world application, "n" cannot go to infinity. However, as "n" becomes larger, the maximum distance-1 distortion decreases. In real world applications, it is quite practical to have "n" equal to 64, 128, or even a larger number. With "n" equal to 64, the maximum distance-1 distortion may be within tolerable limits for many applications. For example, the maximum distance-1 distortion may be about 19 percent. For example, the maximum distance-1 distortion may be about 19% of the interval being covered. With "n" equal to 64, the average distance-1 distortion may be about 7 percent, which may be within tolerable limits for many applications. For some applications, even with a lower value of "n" (such as 32), the maximum distance-1 distortion and the average distance-1 distortion may be within tolerable limits. If a tighter tolerance is desired, a larger value of "n" may be used.

Figure 7A:
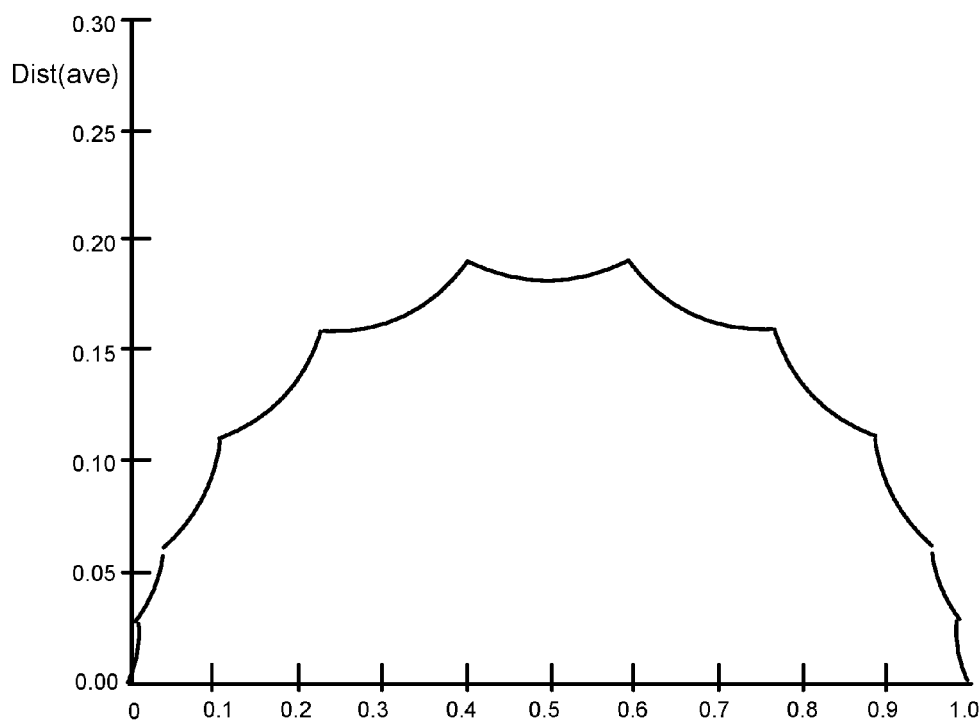
FIG. 7A-7B are diagrams to illustrate the distortion in a mapping of floating point numbers to binary strings.
Figure 7B:
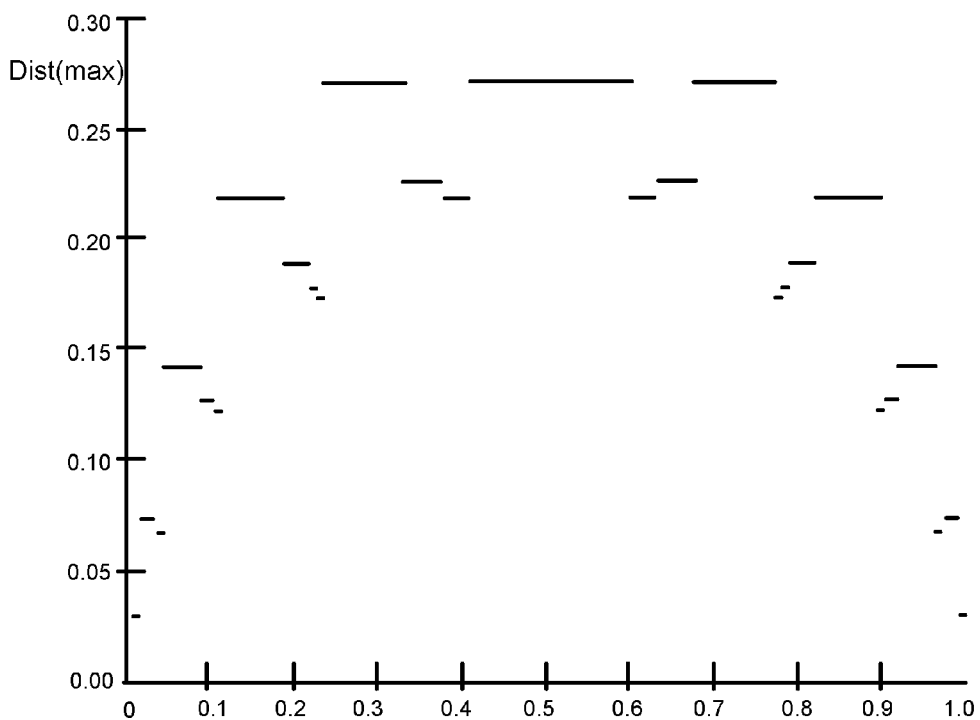

FIG. 7A-7B are diagrams to illustrate a possible distortion in a mapping of floating point numbers to binary strings, in which n=16. That is, each binary string contains 16 bits. These diagrams are for purpose of illustration. The distortion may be considerably less if n is larger than 16.

FIG. 7A shows the average distortion versus binary string for "n" equal to 16. The y-axis represents the average distortion for a given binary string. Recall that for a given binary string there are multiple possible distortions, depending on which bit is flipped. The x-axis represents the distortion for the binary strings. The scale refers to normalized floating point values in the interval [0, 1) to which the binary strings map. The average distortion tends to be higher in the middle of the interval. This may be due to the Hamming groups in the middle having more binary strings. For example, there may be more binary strings with the same Hamming weight in the middle of the interval than at the ends of the interval.

FIG. 7B shows the maximum distortion versus binary string for "n" equal to 16. The y-axis represents the maximum distortion for a given binary string. The x-axis represents the distortion for the binary strings. The scale refers to normalized floating point values in the interval [0, 1) to which the binary strings map.

Figure 8:
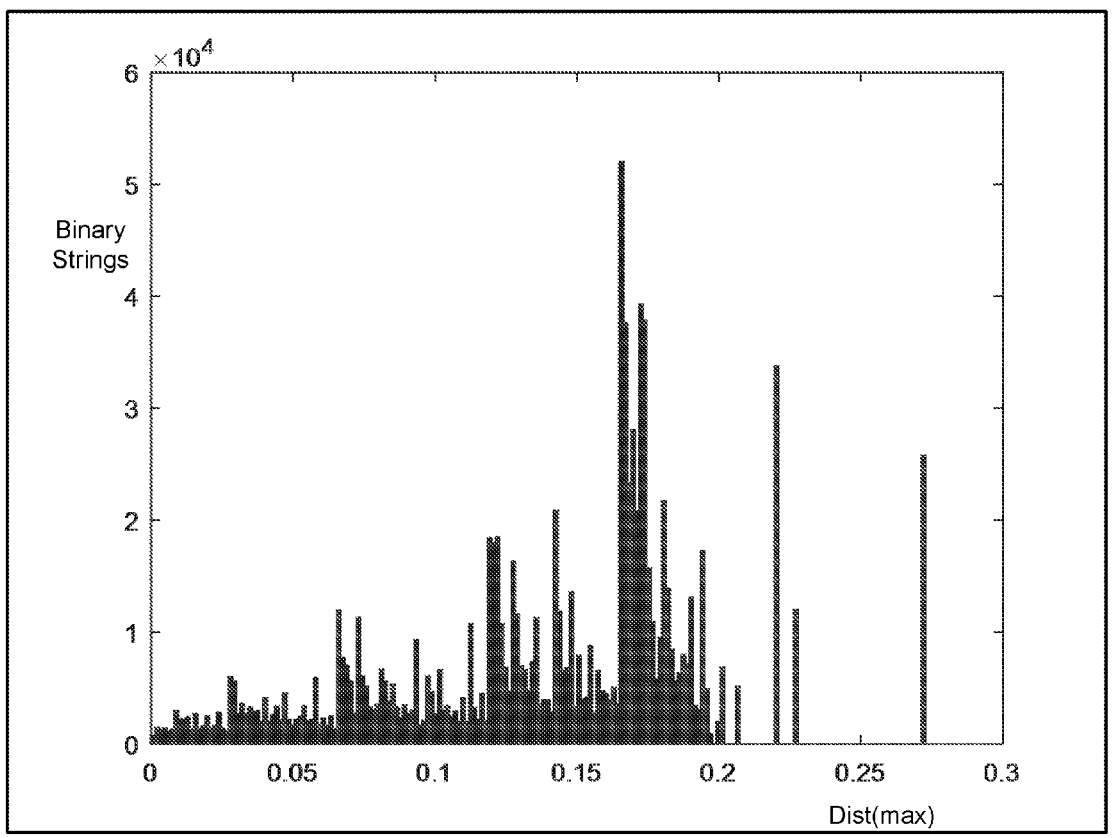
FIG. 8 shows a histogram of distortion in binary strings.

FIG. 8 shows a histogram of distortion in binary strings for "n" equal to 16. The histogram corresponds to the example of FIG. 7B. The x-axis is for the maximum distortion. The y-axis represents the number of strings having a given maximum distortion.

As noted with more bits per binary string the distortion (both average and maximum) may go down. In one embodiment in which the binary strings have 64 bits the maximum distortion (per Equation 4) is less than 0.19. In one embodiment in which the binary strings have 64 bits the average distortion (per Equation 5) is about 0.0704. In stark contrast, in a 64 bit floating point representation using the IEEE 754 standard, flipping a single bit can lead to a distortion of about 100 percent (in absolute value). Also, the naïve representation of FIG. 3 may result in a distortion of about 50 percent in some cases. The maximum distortion in both the IEEE 754 standard and the naïve representation of FIG. 3 may be too high for most applications. Thus, it may be necessary to take steps to assure that bits do not flip when using the IEEE 754 standard or the naïve representation of FIG. 3 to represent floating point numbers in binary format.

In contrast, embodiments disclosed herein that encode numbers (such as floating point numbers) in a binary representation are within a tolerable amount of distortion for many applications including, but not limited to, machine learning algorithms in the event that a bit in the binary representation flips. Hence, embodiments may be able to use fewer or no error correction codes to store the binary representations of the numbers. Embodiments may be able to over-clock a memory that stores the binary representations of the numbers.

Figure 9:
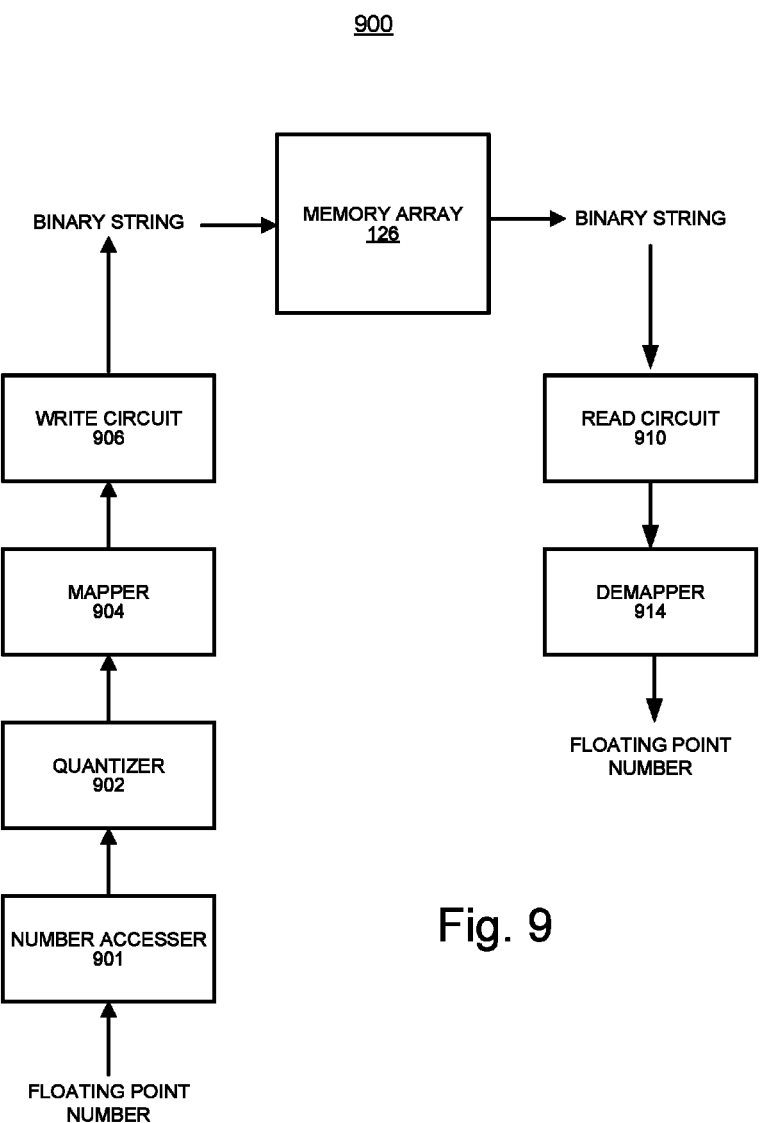
FIG. 9 is a diagram of one embodiment of a system that is configured to encode/decode between floating point numbers and binary strings.

FIG. 9 is a diagram of one embodiment of a system 900 that is configured to encode/decode between floating point numbers and binary strings. The system includes quantizer number accesser 901, quantizer 902, mapper 904, write circuit 906, read circuit 910, and demapper 914. Also depicted is a memory array 126 into which the binary strings may be stored and read back from. For the sake of discussion, the binary strings each have "n" bits.

The number accesser 901 is configured to access a digital representation of a floating point number which may be represented in, for example, the IEEE 754 standard. In one embodiment, the number accesser 901 is configured to receive digital representations of numbers from host 140. The number accesser 901 is front end module (FIG. 2B, 208), in one embodiment. In one embodiment, number accesser 901 performs step 602 of process 600.

The quantizer 902 may be configured to assign the floating point number to one of 2^n sub-intervals, in one embodiment. In one embodiment, quantizer 902 performs step 604 of process 600. In one embodiment, quantizer 902 performs step 604 of process 600.

The mapper 904 may be configured to map the quantized floating point number to a binary string. Stated another way, the mapper 904 may be configured to encode the quantized floating point number as a binary string. In one embodiment, mapper 904 performs step 606 of process 600. In one embodiment, mapper 904 performs process 650. In one embodiment, the mapper 904 may map from the sub-interval to the binary string. In one embodiment, the mapper 904 selects a binary string index for the floating point number, based on where the floating point number is within the interval. The binary string indices may correspond to Hamming groups of binary strings. Each of the Hamming groups may have binary strings of a certain Hamming distance to a base binary string. In one embodiment, each of the Hamming groups has binary strings of a certain Hamming weight. For example, in FIG. 5A, the Hamming groups 502(0)-502(n) may have indices between 0 and n. As noted, the mapper 904 may select the index based on where the floating point number is within an interval. For example, with reference in FIG. 5B, the mapper 904 may determine which sub-interval the quantized floating point number is in.

The write circuit 906 is configured to store the binary stings into the memory array 126. In one embodiment, the binary string is stored in the memory array 126 without any redundant bits. However, redundant bits could be used. The write circuit 906 could be implemented with any combination of controller 122, state machine 112, on-chip address decoder 114, power control 116, read-write circuits 128, and/or decoders 124, 132. In one embodiment, write circuit 906 performs step 608 of process 600.

The read circuit 910 is configured to read the binary stings from the memory array 126. The read circuit 906 could be implemented with any combination of controller 122, state machine 112, on-chip address decoder 114, power control 116, read-write circuits 128, and/or decoders 124, 132.

The demapper 914 may be configured to demap the binary string back to a floating point number. The demapper 914 perform the inverse of the mapping. In one embodiment, the output of the demapper 914 is one of 2^n floating point values. As a simple example, with reference to table 400 in FIG. 4, the decoder output one of the 16 floating point values.

In one embodiment, the quantizer 902, mapper 904, and demapper 914 are implemented within the controller 122 of memory system 100. In one embodiment, the quantizer 902, mapper 904, and demapper 914 are implemented within the ECC engine 224 of controller 122. The quantizer 902, mapper 904, and demapper 914 could be implemented with any combination of hardware and/or software. In one embodiment, the quantizer 902, mapper 904, and demapper 914 are implemented in hardware for faster encoding and decoding. For example, the quantizer 902, mapper 904, and demapper 914 may be implemented within or by an application specific integrated circuit (ASIC), a Field Programmable Gate Array (FPGA), a circuit, a digital logic circuit, an analog circuit, a combination of discrete circuits, gates, or any other type of hardware or combination thereof.

A first embodiment includes an apparatus for encoding numbers into binary form. The apparatus comprises a number accesser configured to access representations of numbers stored in non-transitory storage. The numbers are in an interval that comprises 2^n non-overlapping sub-intervals that cover the interval. The apparatus comprises a quantizer configured to assign the respective numbers to one of the 2^n non-overlapping sub-intervals in accordance with a location of the respective number within the interval. The apparatus comprises a mapper configured to encode each of the respective numbers as a binary string in non-transitory storage based on the assigned sub-interval. The binary string being one of 2^n binary strings of length "n" that are ordered across the interval in accordance with Hamming distance from a base binary string of length "n."

In a second embodiment, in accordance with the first embodiment, the $2^n$ binary strings are clustered across the interval in n+1 Hamming groups, wherein each Hamming group comprises only binary strings with the same Hamming distance from the base binary string.

In a third embodiment, in accordance with the first through second embodiments, the interval comprises n+1 non-overlapping sub-intervals that correspond to the n+1 Hamming groups, wherein the control circuit is further configured to map all numbers assigned to a given sub-interval of the n+1 sub-intervals to the Hamming group that corresponds to the given sub-interval.

In a fourth embodiment, in accordance with the first through third embodiments, within each of the n+1 Hamming groups, the binary strings are ordered according to binary value, wherein the mapper is further configured to map the numbers assigned to the given sub-interval in accordance with the binary values of the binary strings in the Hamming group that corresponds to the given sub-interval.

In a fifth embodiment, in accordance with the first through fourth embodiments, the mapper is further configured to map all numbers assigned to a given sub-interval of the $2^n$ sub-intervals to the same binary string.

In a sixth embodiment, in accordance with the first through fifth embodiments, the numbers are digital representations of floating point numbers.

In a seventh embodiment, in accordance with the first through sixth embodiments, wherein to assign respective numbers in the interval to one of $2^n$ non-overlapping sub-intervals the quantizer is further configured to: uniformly quantize the floating point numbers in the interval into the $2^n$ sub-intervals.

In an eighth embodiment, in accordance with the first through seventh embodiments, the apparatus further comprises non-volatile storage, a write circuit configured to store the binary strings that represent the respective numbers in the non-volatile storage; and a demapper configured to decode the stored binary strings with at least one of the binary strings having a bit flipped, wherein the binary string with the bit flipped decodes to a number in the interval other than the number the binary string represented when encoded.

In a ninth embodiment, in accordance with the first through eighth embodiments, the base binary string comprises all zeros.

One embodiment includes a method comprising the following. A control circuit accesses digital representations of respective numbers in an interval. The interval has $2^n$ non-overlapping sub-intervals that cover the interval. The control circuit assigns the respective numbers to one of the $2^n$ non-overlapping sub-intervals. The assigning is performed in accordance with a location of the respective numbers within the interval. The control circuit encodes each of the respective numbers to a selected binary string of $2^n$ binary strings that are ordered across the interval by Hamming weight. The encoding is based on the assigned sub-interval. The control circuit stores the selected binary strings in non-transitory storage. In one embodiment, the non-transitory storage is non-volatile storage.

One embodiment includes an apparatus that comprises non-volatile storage and means for accessing digital representations of numbers stored in non-transitory storage. The numbers being in an interval that comprises $2^n$ non-overlapping sub-intervals that cover the interval. The $2^n$ sub-intervals are ordered from a first end of the interval to a second end of the interval. The apparatus comprises means for assigning the respective numbers to one of $2^n$ non-overlapping sub-intervals, including means for assigning in accordance with a location of the respective numbers within the interval. The apparatus comprises means for encoding each of the respective numbers to a selected binary string of $2^n$ binary strings that are ordered across the interval by Hamming weight. The apparatus comprises means for storing the selected binary strings in the non-volatile storage.

In one embodiment, the means for accessing digital representations of respective numbers comprises one or more of controller 122, processor 122c, front end module 208, and/or number accesser 901. The means for accessing digital representations of respective numbers may comprise other electronic circuitry.

In one embodiment, the means for assigning the respective numbers to one of $2^n$ non-overlapping sub-intervals comprises one or more of controller 122, processor 122c, quantizer 902. The means for assigning the respective numbers to one of $2^n$ non-overlapping sub-intervals may comprise other electronic circuitry.

In one embodiment, the means for encoding each of the respective numbers to a selected binary string of $2^n$ binary strings that are ordered across the interval by Hamming weight comprises one or more of controller 122, processor 122c, and/or mapper 904. The means for encoding may comprise other electronic circuitry.

In one embodiment, the means for storing the selected binary strings in the non-volatile storage comprises one or more of controller 122, state machine 112, on-chip address decoder 114, power control 116, read-write circuits 128, and/or decoders 124, 132, and/or write circuit 906. The means for storing may comprise other electronic circuitry.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus for encoding numbers into binary form, comprising:
   a number accesser configured to access representations of numbers stored in non-transitory storage, the numbers being in an interval that comprises $2^n$ non-overlapping sub-intervals that cover the interval;
   a quantizer configured to assign the respective numbers to one of the $2^n$ non-overlapping sub-intervals in accordance with a location of the respective number within the interval; and
   a mapper configured to encode each of the respective numbers as a binary string in non-transitory storage based on the assigned sub-interval, the binary string being one of $2^n$ binary strings of length "n" that are ordered across the interval in accordance with Hamming distance from a base binary string of length "n".

2. The apparatus of claim 1, wherein the $2^n$ binary strings are clustered across the interval in n+1 Hamming groups, wherein each Hamming group comprises only binary strings with the same Hamming distance from the base binary string.

3. The apparatus of claim 2, wherein the interval comprises n+1 non-overlapping sub-intervals that correspond to the n+1 Hamming groups, wherein the mapper is further configured to encode all numbers assigned to a given sub-interval of the n+1 sub-intervals to the Hamming group that corresponds to the given sub-interval.

4. The apparatus of claim 3, wherein, within each of the n+1 Hamming groups, the binary strings are ordered according to binary value, wherein the mapper is further configured to encode the numbers assigned to the given sub-interval in accordance with the binary values of the binary strings in the Hamming group that corresponds to the given sub-interval.

5. The apparatus of claim 1, wherein the mapper is further configured to encode all numbers assigned to a given sub-interval of the $2^n$ sub-intervals to the same binary string.

6. The apparatus of claim 1, wherein the representations of the numbers are digital representations of floating point numbers.

7. The apparatus of claim 6, wherein to assign respective numbers in the interval to one of $2^n$ non-overlapping sub-intervals the quantizer is further configured to:
uniformly quantize the floating point numbers in the interval into the $2^n$ sub-intervals.

8. The apparatus of claim 1, further comprising:
non-volatile storage;
a write circuit configured to store the binary strings that represent the respective numbers in the non-volatile storage; and
a demapper configured to decode the stored binary strings with at least one of the binary strings having a bit flipped, wherein the binary string with the bit flipped decodes to a number in the interval other than the number the binary string represented when encoded.

9. The apparatus of claim 1, wherein the base binary string comprises all zeros.

10. A method, comprising:
accessing, by a control circuit, digital representations of respective numbers stored in non-transitory storage, the numbers being in an interval that comprises $2^n$ non-overlapping sub-intervals that cover the interval;
assigning, by the control circuit, the respective numbers to one of the $2^n$ non-overlapping sub-intervals, wherein the assigning is performed in accordance with a location of the respective numbers within the interval;
encoding, by the control circuit, each of the respective numbers as a selected binary string of $2^n$ binary strings that are ordered across the interval by Hamming weight, the encoding being based on the assigned sub-interval; and
storing, by the control circuit, the selected binary strings in non-transitory storage.

11. The method of claim 10, wherein the $2^n$ binary strings are clustered across the interval in n+1 Hamming groups, wherein each Hamming group comprises only binary strings with the same Hamming weight.

12. The method of claim 11, wherein the interval comprises n+1 non-overlapping sub-intervals that correspond to the n+1 Hamming groups, further comprising:
encoding all numbers in a given sub-interval of the n+1 sub-intervals to the Hamming group that corresponds to the given sub-interval.

13. The method of claim 12 wherein, within each of the n+1 Hamming groups, the binary strings are ordered according to binary value, and further comprising:
encoding, by the control circuit, the numbers in the given sub-interval in accordance with the binary values of the binary strings in the Hamming group that corresponds to the given sub-interval.

14. The method of claim 10, further comprising:
encoding, by the control circuit, all numbers assigned to a given sub-interval of the $2^n$ sub-intervals to the same binary string.

15. The method of claim 10, wherein assigning the respective numbers to one of the $2^n$ non-overlapping sub-intervals comprises:
uniformly quantizing, by the control circuit, floating point numbers in the interval into the "$2^n$" sub-intervals.

16. An apparatus comprising:
non-volatile storage;
means for accessing digital representations of numbers stored in non-transitory storage, the numbers being in an interval that comprises $2^n$ non-overlapping sub-intervals that cover the interval, wherein the $2^n$ sub-intervals are ordered from a first end of the interval to a second end of the interval;
means for assigning the respective numbers to one of the $2^n$ non-overlapping sub-intervals, including means for assigning in accordance with a location of the respective numbers within the interval;
means for encoding each of the respective numbers to a selected binary string of $2^n$ binary strings that are ordered across the interval by Hamming weight; and
means for storing the selected binary strings in the non-volatile storage.

17. The apparatus of claim 16, wherein the means for assigning the respective numbers to one of the $2^n$ non-overlapping sub-intervals comprises:
means for uniformly quantizing floating point numbers into one of the $2^n$ sub-intervals that correspond to the $2^n$ binary strings.

18. The apparatus of claim 17, wherein the $2^n$ binary strings are clustered across the interval in n+1 Hamming groups, wherein the interval comprises n+1 non-overlapping sub-intervals that correspond to the n+1 Hamming groups, further comprising:
means for encoding all numbers in a given sub-interval of the n+1 sub-intervals to the Hamming group that corresponds to the given sub-interval of the n+1 sub-intervals.

19. The apparatus of claim 16, wherein the means for encoding comprises:
means for encoding all numbers assigned to a given sub-interval of the $2^n$ sub-intervals to the same binary string of the $2^n$ binary strings.

20. The apparatus of claim 16, further comprising:
means for decoding the selected binary strings that were stored in the non-volatile storage.

* * * * *